(12) United States Patent
Mandela et al.

(10) Patent No.: US 9,077,327 B2
(45) Date of Patent: Jul. 7, 2015

(54) OPTIMIZED PEAK DETECTOR FOR THE AGC LOOP IN A DIGITAL RADIO RECEIVER

(71) Applicant: Texas Instruments Incorporated, Dallas, TX (US)

(72) Inventors: Venkateswara Rao Mandela, Karnataka (IN); Thomas Sojan PJ, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/070,825

(22) Filed: Nov. 4, 2013

(65) Prior Publication Data

US 2015/0123711 A1      May 7, 2015

(51) Int. Cl.
*H03K 5/153*      (2006.01)
*H03K 5/1532*      (2006.01)

(52) U.S. Cl.
CPC .................................. *H03K 5/1532* (2013.01)

(58) Field of Classification Search
CPC .. G01R 19/04; G01R 19/0038; H03K 5/1532; H03K 5/082; G11B 20/10009
USPC ............................................................ 327/58
See application file for complete search history.

(56) References Cited

U.S. PATENT DOCUMENTS 6,548,086 B1 *   4/2003   Maurya et al. ................. 424/725
8,406,789 B1 *   3/2013   Thompson ................. 455/456.1

* cited by examiner

*Primary Examiner* — Quan Tra
(74) *Attorney, Agent, or Firm* — Robert D. Marshall, Jr.; Frank D. Cimino

(57) ABSTRACT

A method of peak detection applicable to complex in-phase and quadrature phase signals in a digital radio receiver where the incoming signal is divided into a plurality of frames. Each frame is then further divided into a plurality of smaller blocks, and the signal peak is determined in each block individually followed by selecting the peak signal value from the said blocks.

3 Claims, 1 Drawing Sheet

OPTIMIZED PEAK DETECTOR FOR THE AGC LOOP IN A DIGITAL RADIO RECEIVER

TECHNICAL FIELD OF THE INVENTION

The technical field of this invention is digital radio architecture.

BACKGROUND OF THE INVENTION

Automatic Gain Control (AGC) was implemented in first radios for the reason of fading propagation (defined as slow variations in the amplitude of the received signals) which required continuing adjustments in the receiver's gain in order to maintain a relative constant output signal.

This situation led to the design of circuits, whose primary function was to maintain a constant signal level at the output, regardless of the signal's variations at the input of the system.

Now AGC circuits can be found in any device or system where wide amplitude variations in the output signal could lead to a loss of information or to an unacceptable performance of the system.

Automatic Gain Control (AGC) circuits are employed in many systems where the amplitude of an incoming signal can vary over a wide dynamic range. The role of the AGC circuit is to provide relatively constant output amplitude so that circuits following the AGC circuit require less dynamic range.

If the signal level changes are much slower than the information rate contained in the signal, then an AGC circuit can be used to provide a signal with a well-defined average level to downstream circuits. In most system applications, the time to adjust the gain in response to an input amplitude change should remain constant, independent of the input amplitude level and hence gain setting of the amplifier. The large dynamic range of signals that must be handled by most receivers requires gain adjustment to prevent overload or IM of the stages and to adjust the demodulator input level for optimum operation.

A simple method of gain control would involve the use of a variable attenuator between the input and the first active stage. Such an attenuator, however, would decrease the signal level, but it would also reduce the S/N of any but the weakest acceptable signal.

Gain control is generally distributed over a number of stages, so that the gain in later stages (the IF amplifiers) is reduced first, and the gain in earlier stages (RF and first IF) is reduced only for signal levels sufficiently high to assure a large S/N.

SUMMARY OF THE INVENTION

An AGC implementation is shown that reduces the computations required to get the signal level indicator by trading off accuracy. However this will not affect the performance of AGC loop since the AGC loop does not require an accurate value of signal level.

BRIEF DESCRIPTION OF THE DRAWINGS

These and other aspects of this invention are illustrated in the drawings, in which.

DETAILED DESCRIPTION OF PREFERRED EMBODIMENTS

In the current art implementing the AGC function in a digital radio receiver, the peak detector fetches the maximum value of the IF samples and assigns the value as Peak detector value. The peak detector value decays at a rate determined by the Peak Decay Time Constant until it encounters an IF sample value greater than the current Peak detector value. When it encounters an IF sample value greater than the current Peak detector value, it assigns this value as the new Peak detector value. This is shown below where:

IF_I=the In phase portion of the complex IF input from the ADC

IF_Q=the Quadrature portion of the complex IF input from the ADC

MaxIF=the maximum of each IF_I, IF_Q pair

PeakIF=the output of the peak detector based on the incoming complex IF signal

PeakDetectDecayk=Peak Detector decay time constant.

For every IF sample, we calculate.

$$Max IF = Max(|IF\_I|, |IF\_Q|)$$

$$\text{If } (Max IF > Peak IF)$$

$$Peak IF = Max IF$$

else $$Peak IF = Peak IF * PeakDetectDecay k$$

Peak decay time constant controls the decay time of the peak Detector.

If 'X' is the decay time constant, the peak value is decayed at the rate of 16384*20 log(X)dB/8 msec, when no bigger peaks are encountered in the IF samples.

In the novel implementation shown in this invention, instead of running through all of the IQ samples to find the peak value, we divide the complete input frame to N blocks and find the max value out of each block. The original peak detector algorithm is run over these maximum values. This in effect reduces the number of multiplication. The block size is decided on the basis of required accuracy.

Figure 1:
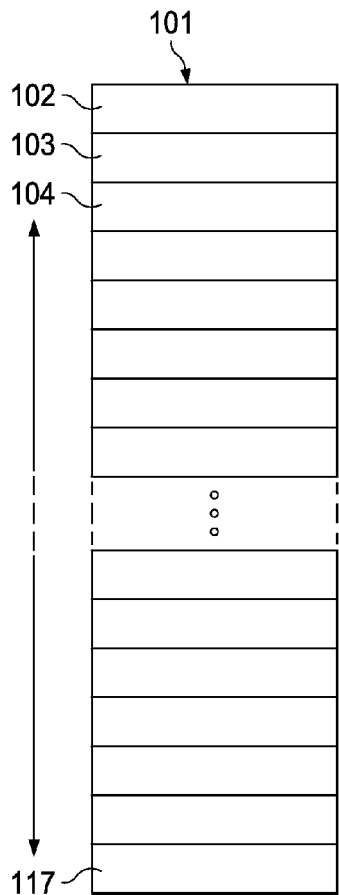
FIG. 1 shows the block structure used in the invention.
Figure 2:
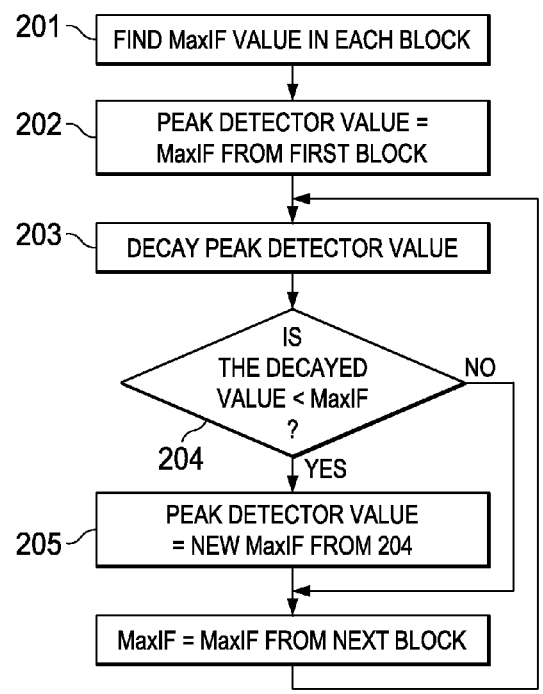
FIG. 2 shows a flowchart of an implementation of the invention.

FIG. 1 shows frame 101 which consists of N IF samples is partitioned into smaller blocks, for example if N=16384 samples may be divided into blocks of 1024 samples. In this case, each frame consists of 16 blocks 102 through 117. Block 201 (FIG. 2) illustrates that from each block, the Peak detector finds a MaxIF value (Which is the maximum of I or Q value in the block).

In block 202, the MaxIF value from the very first block is assigned as the Peak detector value. In block 203, this value decays at a rate determined by the Peak decay Time Constant until it encounters a MaxIF value in any of the blocks, greater than the current Peak detector value (block 204). When it encounters a MaxIF value in any of the blocks, greater than the current Peak detector value, block 205 assigns this value as the new Peak detector value. This is shown below where:

IF_In=the Inphase portion of the complex IF input from the ADC for the nth sample in a block;

IF_Qn=the Quadrature portion of the complex IF input from the ADC for the nth sample in a block;

MaxIF=the maximum of Inphase or Quadrature part in a block;

PeakIF=the output of the peak detector based on the incoming complex IF signal;

PeakDetectDecayk=Peak Detector decay time constant.

For every block, we calculate:

$$\text{Max}IF = \text{Max}(|IF\_I1|, |IF\_Q1|, |IF\_I2|, |IF\_Q2|, |IF\_I3|, |IF\_Q3|, \ldots |IF\_In|IF\_Qn|)$$

If(Max*IF*>Peak*IF*)

Peak*IF*=Max*IF* else

Peak*IF*=Peak*IF*\*PeakDetectDecay*k*

Peak decay time constant controls the decay time of the peak Detector.

If 'X' is the decay time constant, the peak detector value is decayed at the rate of 16*20 log(X)dB/8 msec, when no bigger peaks are encountered in the IF samples.

What is claimed is:

1. A method of peak detection of complex signals comprising the steps of:
   dividing the input signals into frames of a predefined length;
   dividing said frames into block of a predefined number of samples;
   determining the peak in-phase and quadrature phase signal of the predetermined number of samples in each block;
   selecting the peak in-phase or quadrature phase signal from the previously determined peaks in each block;
   decaying a peak of a prior block; and
   determining a peak of a next block as the larger of the selected peak of in-phase or quadrature phase signals or the decayed peak of the prior block.

2. The method of peak detection of claim 1 wherein the length of said blocks of samples is determined based on the required accuracy of the peak detection.

3. The method of peak detection of claim 1 wherein:
   said step of decaying the prior peak decays at the rate of 16*20 log(X)dB/8 msec, where X is a decay time constant.

\* \* \* \* \*